(12) United States Patent
Fayrushin et al.

(10) Patent No.: US 10,803,948 B2
(45) Date of Patent: Oct. 13, 2020

(54) SEQUENTIAL VOLTAGE RAMP-DOWN OF ACCESS LINES OF NON-VOLATILE MEMORY DEVICE

(71) Applicant: Micron Technology, Inc., Boise, ID (US)

(72) Inventors: Albert Fayrushin, Boise, ID (US); Augusto Benvenuti, Lallio (IT); Akira Goda, Boise, ID (US); Luca Laurin, Lissone (IT); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/183,414

(22) Filed: Nov. 7, 2018

(65) Prior Publication Data

US 2020/0143884 A1 May 7, 2020

(51) Int. Cl.
*G11C 16/08* (2006.01)
*G11C 16/24* (2006.01)
*G11C 16/26* (2006.01)
*G11C 16/16* (2006.01)
*G11C 16/04* (2006.01)

(52) U.S. Cl.
CPC .......... *G11C 16/08* (2013.01); *G11C 16/0483* (2013.01); *G11C 16/16* (2013.01); *G11C 16/24* (2013.01); *G11C 16/26* (2013.01)

(58) Field of Classification Search
CPC ..... G11C 16/08; G11C 16/0483; G11C 16/16; G11C 16/24; G11C 16/26
See application file for complete search history.

(56) References Cited

U.S. PATENT DOCUMENTS

2012/0250414 A1* 10/2012 Khandelwal ........... G11C 16/26
365/185.17
2018/0261267 A1* 9/2018 Shimura .............. G11C 7/1051

* cited by examiner

*Primary Examiner* — Tri M Hoang
(74) *Attorney, Agent, or Firm* — Schwegman Lundberg & Woessner, P.A.

(57) ABSTRACT

Some embodiments include apparatuses and methods of operating the apparatuses. One of the apparatuses includes a memory cell string having first, second, third, fourth, and fifth memory cells; access lines including first, second, third, fourth, and fifth access lines coupled to the first, second, third, fourth, and fifth memory cells, respectively, and a module. The first memory cell is between the second and third memory cells. The second memory cell is between the first and fourth memory cells. The third memory cell is between the first and fifth memory cells. The module is to couple the first access line to a ground node at a first time of a memory operation, couple the second and third access lines to the ground node at a second time of the operation after the first time, and couple the fourth and fifth access lines to the ground node at a third time of the operation after the second time.

12 Claims, 7 Drawing Sheets

SEQUENTIAL VOLTAGE RAMP-DOWN OF ACCESS LINES OF NON-VOLATILE MEMORY DEVICE

BACKGROUND

Non-volatile devices, such as flash memory devices, are widely used in computers and many electronic items to store information. A flash memory device has numerous memory cells. The memory device performs a write operation to store information in the memory cells, a read operation to read the stored information, and an erase operation to erase information (e.g., obsolete information) from some or all of the memory cells the memory device. Such a memory device has access lines to access the memory cells during a memory operation (e.g., read, write, or erase operation). The memory device also has data lines to carry information (e.g., in the form of signals) to be stored in or read from the memory cells. In the structure of the memory device, the memory cells can be formed along respective pillars. Each of the pillars often includes polysilicon material that forms part of a conductive path (e.g., a channel) coupled to the memory cells. However, the polysilicon material can be unstable under certain stress conditions, such as under the influence of a relatively high electric field in the pillar during some states or operations of the memory device. The high electric field can affect the threshold voltages of memory cells along the pillar. This can impact operations and performance of the memory device.

DETAILED DESCRIPTION

The techniques described herein include a sequential ramp-down operation to sequentially decrease voltages on access lines (e.g., word lines) of a non-volatile memory device (e.g., a 3-D NAND flash memory device). The sequential ramp-down operation can be performed after a particular operation (e.g., a read or write operation) or during a particular state (e.g., an idle state between operations) of the memory device. The described techniques can adjust (e.g., reduce) a negative potential of the pillar of the memory cells of the memory device according to the threshold voltages of the memory cells. The techniques described herein can help reduce an electric field in a tunnel oxide (e.g., a dielectric material) between the channel in the pillar and the memory element of the memory cell. This can prevent slow read disturb for lower level memory cells (e.g., memory cells having a lower threshold voltage). The techniques described herein can also help relax an electric field in the channel of the pillar. This can prevent traps (charge) generation that may occur in higher level memory cells (e.g., memory cells having a higher lower threshold voltage). The memory cells of the memory device using the described techniques can have near flat band condition in the idle state. The techniques described herein can also help reduce the number of electrons in the channel of the pillar after a write verify stage of a write operation and help lower level memory cells to obtain a lower negative channel boosting. This can mitigate program disturb after a write verify stage of a write operation. Other improvements and benefit of the techniques described herein are discussed below with reference to FIG. 1 through FIG. 7.

Figure 1:
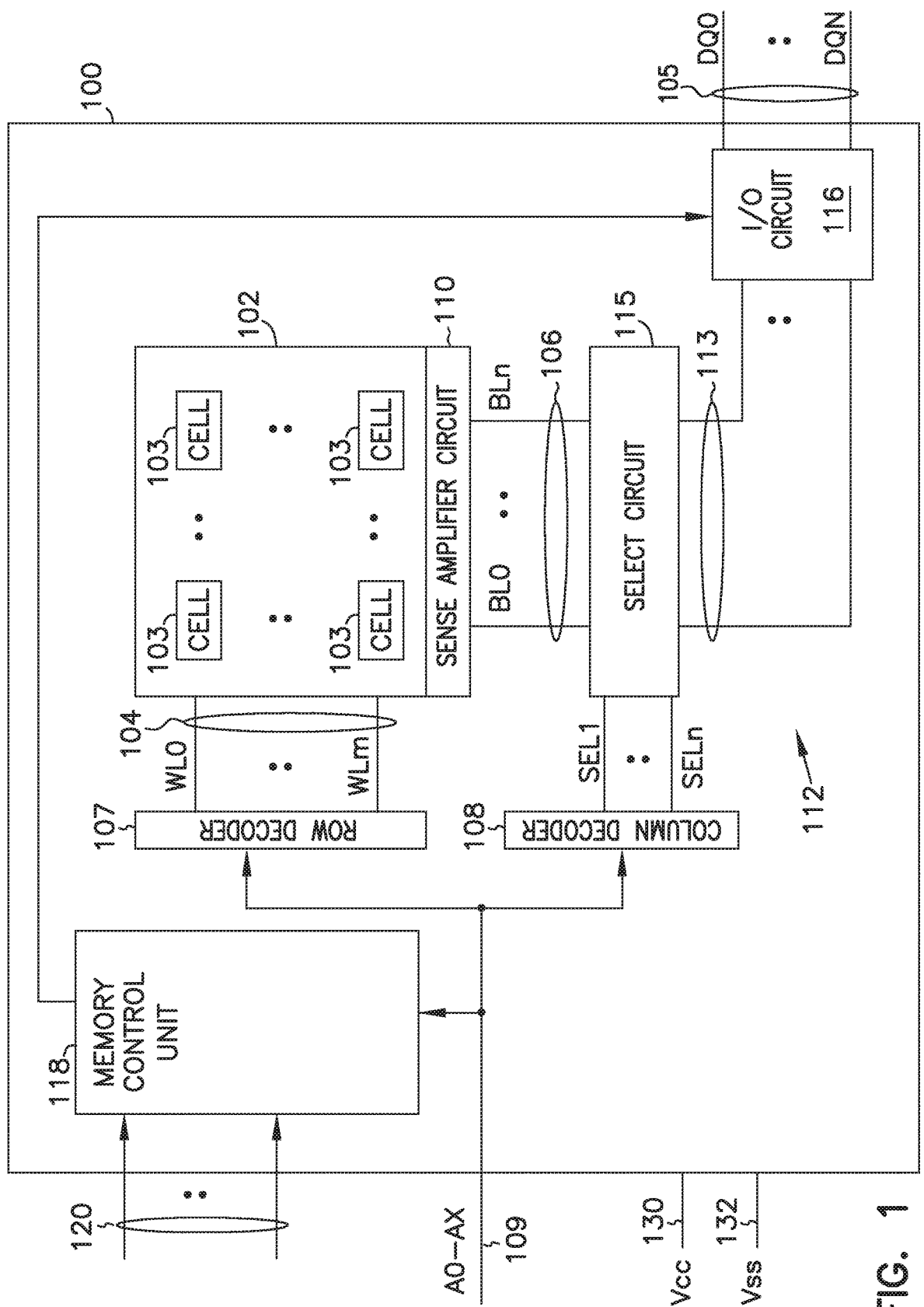
FIG. 1 shows a block diagram of an apparatus in the form of a memory device, according to some embodiments of the invention.

FIG. 1 shows a block diagram of an apparatus in the form of a memory device 100, according to some embodiments of the invention. Memory device 100 can include a memory array 102 having a number of memory cells 103. Memory cells 103 can be arranged in rows and columns along with access lines 104 (e.g., word lines to conduct signals WL0 through WLm) and data lines 106 (e.g., bit lines to conduct signals BL0 through BLn). Memory device 100 can use access lines 104 and data lines 106 to transfer information to and from memory cells 103. A row decoder 107 and a column decoder 108 decode address signals A0 through AX on address lines 109 to determine which ones of memory cells 103 are to be accessed.

A sense amplifier circuit 110 operates to determine the value of information read from memory cells 103 and transmits the information in the form of signals to data lines 106. Sense amplifier circuit 110 can also use the signals on data lines 106 to determine the values of information to be written to memory cells 103.

Memory device 100 is further shown to include circuitry 112 to transfer information between memory array 102 and input/output (I/O) lines 105. Signals DQ0 through DQN on I/O lines 105 can represent information read from or to be written into memory cells 103. I/O lines 105 can include nodes within memory device 100 (or alternatively, pins, solder balls, or other interconnect technologies such as controlled collapse chip connections (C4), or flip chip attach (FCA)) on a package where memory device 100 can reside. Other devices external to memory device 100 (e.g., a memory controller or a processor, not shown in FIG. 1) can communicate with memory device 100 through I/O lines 105, address lines 109, or control lines 120.

Memory device 100 can perform memory operations, such as a read operation, to read information from selected ones of memory cells 103; and a write operation (e.g., a programming operation) to store (e.g., to program) information in selected ones of memory cells 103. Memory device 100 can also perform an erase operation to erase information from some or all of memory cells 103. A memory control unit 118 controls memory operations based on signals present on control lines 120. Examples of the signals presented on control lines 120 can include one or more clock signals and other signals to indicate which operation (e.g., read, write, or erase operation) memory device 100 can or should perform. Other devices external to memory device 100 (e.g., a processor or a memory controller) can control the values of control signals on control lines 120. Specific combinations of values of the signals on control lines 120 can produce a command (e.g., a write, read, or erase command) that can cause memory device 100 to perform a corresponding memory operation (e.g., a write, read, or erase operation).

Each of memory cells 103 can be programmed to a different one of at least two data states to represent, for example, a value of a single bit or a value of multiple bits such as two, three, four, or a higher number of bits. For example, each of memory cells 103 can be programmed to one of two data states to represent a binary value of "0" or "1" of a single bit. Such a cell is sometimes called a single level cell. In another example, each of memory cells 103 can be programmed to one of more than two data states to represent a value of, for example, multiple bits, such as one of four possible values "00," "01," "10," and "11" of two bits, one of eight possible values "000," "001," "010," "011," "100," "101," "110," and "111" of three bits, or one of another set of values of multiple bits. A cell that can be programmed to more than two data states is sometimes referred to as a multi-level cell (or multi-state cell).

Memory device 100 can receive a supply voltage, including supply voltage signals Vcc and Vss, on a supply line 130 and a supply line 132, respectively. Supply voltage signal Vss can, for example, be at a ground potential (e.g., having a value of approximately zero volts). Supply voltage signal Vss can also operate at other voltages. Supply voltage signal Vcc can include an external voltage supplied to memory device 100 from an external power source such as a battery or an alternating-current to direct-current (AC-DC) converter circuitry (not shown in FIG. 1).

Circuitry 112 of memory device 100 is further shown to include a select circuit 115 and an I/O circuit 116. Select circuit 115 can respond to signals SEL1 through SELn to select signals on data lines 106 and 113 to represent the information read from or to be programmed into memory cells 103. Column decoder 108 can selectively activate the SEL1 through SELn signals based on the A0 through AX address signals on address lines 109. Select circuit 115 can select the signals on data lines 106 and 113 to provide communication between memory array 102 and I/O circuit 116 during read and write operations.

Memory device 100 can include a non-volatile memory device and memory cells 103 can include non-volatile memory cells, such that memory cells 103 can retain information stored therein when power (e.g., Vcc, Vss, or both) is disconnected from memory device 100.

Each of memory cells 103 can include a memory element having material, at least a portion of which can be programmed to a desired data state (e.g., by storing a corresponding amount of charge on a charge-storage structure, such as a floating-gate structure, a charge-trap structure, or other structures). Different data states can represent different values of information programmed (stored) in each of memory cells 103.

Memory device 100 can perform a write operation when it receives (e.g., from an external processor or a memory controller) a write command and a value of information to be programmed into one or more selected ones of memory cells 103. Based on the value of the information, memory device 100 can program the selected memory cells to appropriate data states to represent the values of the information to be stored therein.

One of ordinary skill in the art may recognize that memory device 100 may include other components, at least some of which are discussed herein. However, several of these components are not necessarily shown in the figure, so as not to obscure the embodiments described. Memory device 100 may include devices and memory cells, and operate using memory operations (e.g., read, write, and erase operations) similar to, or identical to, those described below with reference to FIG. 2 through FIG. 7.

Figure 2:
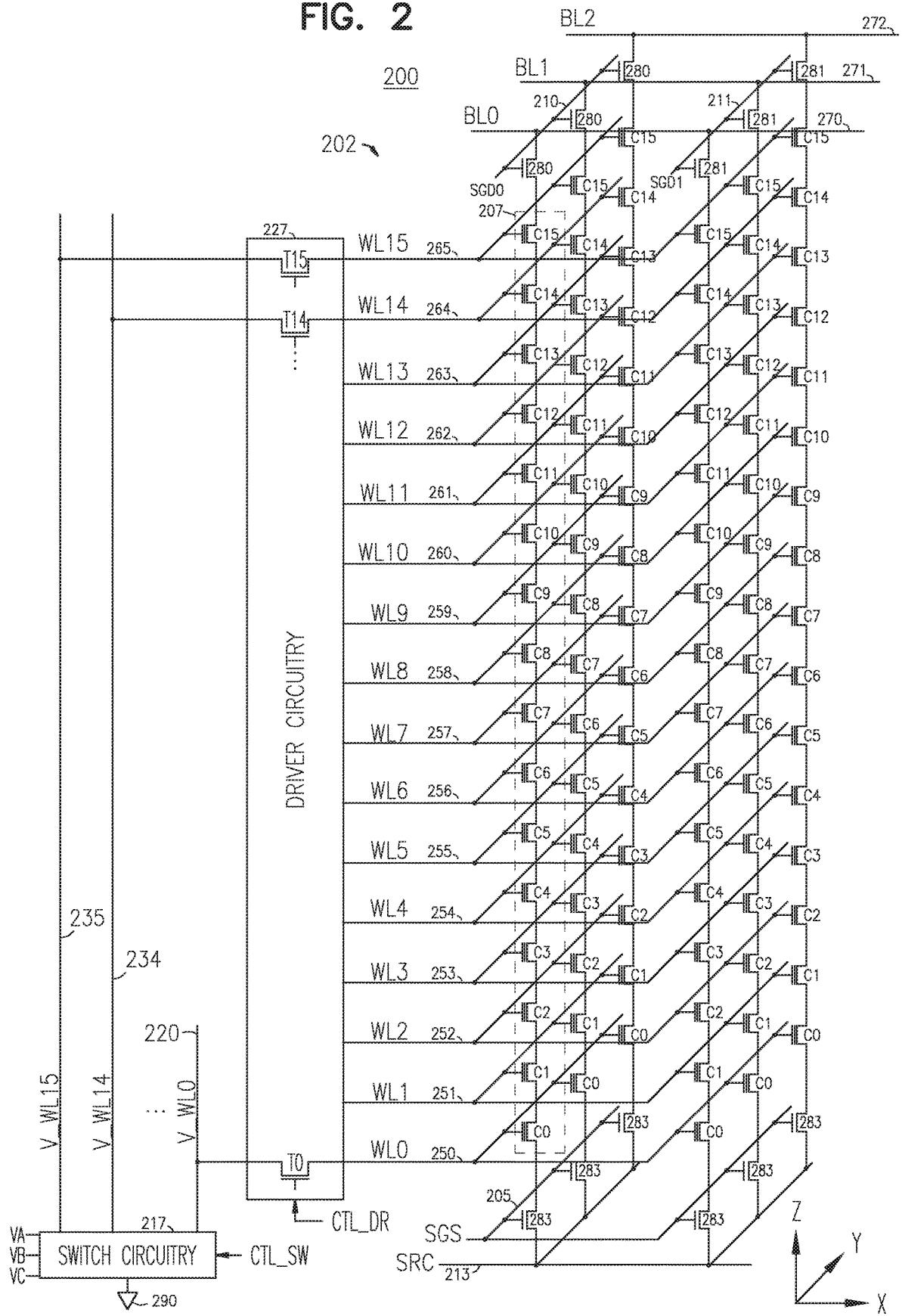
FIG. 2 shows schematic diagram of a memory device, including a memory array and driver circuitry, according to some embodiments of the invention.

FIG. 2 shows schematic diagram of a memory device 200 including memory array 202 and driver circuitry 227, according to some embodiments of the invention. Memory device 200 can correspond to memory device 100 of FIG. 1. For example, memory array 202 can correspond to memory array 102 of memory device 100 of FIG. 1. Driver circuitry 227 of FIG. 2 can be part of a decoder (not shown) of memory device 200 in which the decoder can correspond to row decoder 107 of memory device 100 of FIG. 1.

As shown in FIG. 2, memory device 200 can include data lines (e.g., bit lines) 270, 271, and 272 that can conduct corresponding signals BL0, BL1, and BL2. Data lines 270, 271, and 272 can correspond to data lines 106 of FIG. 1. FIG. 2 shows memory device 200 having three data lines 270, 271, and 272 as an example. However, the number of data lines can vary.

Memory device 200 can include select lines (e.g., drain-side select lines) 210 and 211, a select line (e.g., source-side select line) 205, and a source (e.g., source line) 213. Select line 210 can conduct a signal SGD0 to control (e.g., turn or turn off) select transistors 280. Select line 211 can conduct a signal SGD1 to control (e.g., turn or turn off) select transistors 281. Select line 205 can conduct a signal SGS to control (e.g., turn or turn off) select transistors 283. Source (e.g., source line) 213 can conduct a signal SRC.

Memory device 200 can include access lines 250 through 265 that can conduct corresponding signals WL0 through WL15. Access lines 250 through 265 can correspond to access lines 104 of FIG. 1. FIG. 2 shows memory device 200 having 16 access lines 250 through 265 as an example. However, the number of access lines can vary.

As shown in FIG. 2, memory device 200 can include memory cells C0 through C15. FIG. 2 shows directions X, Y, and Z to indicate that, in the physical structure of memory device 200 (shown in FIG. 3 and described in detail below), memory cells C0 through C15 can be located (e.g., formed) in a Z-direction (e.g., arranged vertically) one over another over a substrate (e.g., a semiconductor substrate). The Z-direction is perpendicular to the X-direction and Y-direction (perpendicular to an X-Y plane).

Memory cells C0 through C15 can be organized in different memory cell strings (e.g., strings of memory cells 103) between source 213 and each of data lines 270, 271, and 273. Each of the memory cell strings can include 16 memory cells C0 through C15 coupled between source 213 and one of data lines 270, 271, and 272. For example, FIG. 2 shows memory cell string 207 including memory cells C0 through C15 coupled between source 213 and data line 270. Other memory cell strings of memory device 200 are not labeled.

FIG. 2 shows memory device 200 having six memory cell strings as an example. However, the number of memory cell strings can vary. Further, FIG. 2 shows memory device 200 having 16 memory cells (e.g., memory cells C0 through C15) in each of the memory cell strings as an example. However, the number of memory cells in each of the memory cell strings can vary.

Access lines 250 through 265 can be shared by different memory cell strings. For example, access line 250 can be shared by memory cells C0 of different memory cell strings, access line 251 can be shared by memory cells C1 of different memory cell strings, and so on. Memory device 200 can use access lines 250 through 265 to access memory cells C0 through C15, respectively, of a particular memory cell string during an operation (e.g., read or write operation) of memory device 200.

Memory device 200 can include conductive lines (e.g., 16 conductive lines) 220 through 235 that can conduct corresponding signals (e.g., 16 corresponding signals V_WL0 through V_WL15). Only conductive lines 220, 234, and 235 (and corresponding signals V_WL0, V_WL14 and V_WL15) are shown in FIG. 2 for simplicity. Each of signals V_WL0 through V_WL15 can be a voltage signal, which is different from a data signal.

During an operation (e.g., a read or a write operation) of memory device 200, memory device 200 can couple each of conductive lines 220 through 235 to one of voltages VA, VB, and VC (e.g., voltages having a value greater than zero), such that each of signals V_WL0 through V_WL15 can be provided with (e.g., biased with) a positive voltage (a voltage having a value greater than zero). In another example, memory device 200 can couple each of conductive lines 220 through 235 to a ground node 290, such that each of signals V_WL0 through V_WL15 can be provided with (e.g., biased with) 0V (e.g., through ground node 290).

Memory device 200 can include switch circuitry 217 that can include switches (e.g., transistors, not shown) to selectively couple each of conductive lines 220 through 235 to voltages VA, VB, and VC or to ground node (e.g., ground connection) 290, depending on the operation (or a particular stage of an operation) of memory device 200. FIG. 2 shows an example of three voltages that can be selectively provided to conductive lines 220 through 235. However, a different number of voltages can be used. Memory device 200 can provide control information CTL_SW to switch circuitry 217 from a memory control unit (which can be similar to memory control unit 118 of FIG. 1). Control information CTL_SW can include a control signal or multiple control signals. The value of control information CTL_DR can be a binary value, which can be a value of a single bit or a value of a combination of multiple bits. Switch circuitry 217 can use (e.g., can respond) to control information CTL_SW to control (e.g., turn on or turn off) switches in switch circuitry 217, such that conductive lines 220 through 235 can be provided with respective voltages VA, VB, and VC or can be coupled to ground node 290.

Driver circuitry 227 can include transistors (e.g., 16 transistors) T0 through T15. Only transistors T0, T14, and T15 are shown in FIG. 2 for simplicity. FIG. 2 shows driver circuitry 227 having 16 transistors (e.g., transistors T0 through T15) an example. However, the number of memory cell strings can vary. For example, the number of transistors of driver circuitry 227 can be equal to the number of access lines (e.g., access lines 250 through 265).

Each of transistors T0 through T15 can include a terminal (e.g., a source terminal) coupled to a respective access line among access lines 250 through 265, and a terminal (e.g., a drain terminal) coupled to a respective conductive line among conductive lines 220 through 235. For example, transistor T0 can include a source terminal coupled to access line 250, and a drain terminal coupled to conductive line 220. Each of transistors T0 through T15 can include a gate that can be controlled by information CTL_DR received by driver circuitry 227.

Memory device 200 can provide control information CTL_DR to driver circuitry 227 from a memory control unit (which can be similar to memory control unit 118 of FIG. 1). Control information CTL_DR can include a control signal or multiple control signals. Control information CTL_DR can have a value to turn on (e.g., concurrently turn on) transistors T0 through T15 or another value to turn off (e.g., concurrently turn off) transistors T0 through T15. The value of control information CTL_DR can be a binary value, which can be a value of a single bit or a value of a combination of multiple bits.

Driver circuitry 227 can respond to control information CTL_DR to control (e.g., turn on or turn off) transistors T0 through T15 to form conductive paths (or to disconnect conductive paths) between access lines 250 through 265 and conductive lines 220 through 235, respectively. For example, driver circuitry 227 can use control information CTL_DR to turn on transistor T0 to form a circuit path (e.g., current path) between access line 250 and conductive line 220 through transistor T0. In another example, driver circuitry 227 can use control information CTL_DR to turn on transistor T15 to form a circuit path (e.g., current path) between access line 265 and conductive line 235 through transistor T15.

Driver circuitry 227 can operate (e.g., based on control information CTL_DR), such that the voltage on each of access lines 250 through 265 can be provided through (e.g., can be dependent on) the voltage on a respective conductive line among conductive lines 220 through 235. For example, if access line 250 is to be coupled to a positive voltage (e.g., one of voltage VA, VB, and VC), then switch circuitry 217 can couple conductive line 220 to such a positive voltage, and driver circuitry 227 can turn on transistor T0 to couple access line 250 to the positive voltage through conductive line 220. In another example, if access line 250 is to be coupled to ground (e.g., 0V), then switch circuitry 217 can couple conductive line 220 ground node 290, and driver circuitry 227 can turn on transistor T0 to couple access line 250 to the ground node 290 through conductive line 220. Similarly, other access lines (e.g., access lines 251 through 265) can also be coupled to a positive voltage or ground node 290 through respective transistors (which are turned on) and respective conductive lines (among conductive lines 220 through 235).

Thus, each of access lines 250 through 265 can be selectively coupled to a positive voltage or ground node 290. As described in more detail below, memory device 200 can perform different operations to couple access lines 250 through 265 to a positive voltage or ground node 290 at different times.

Figure 3:
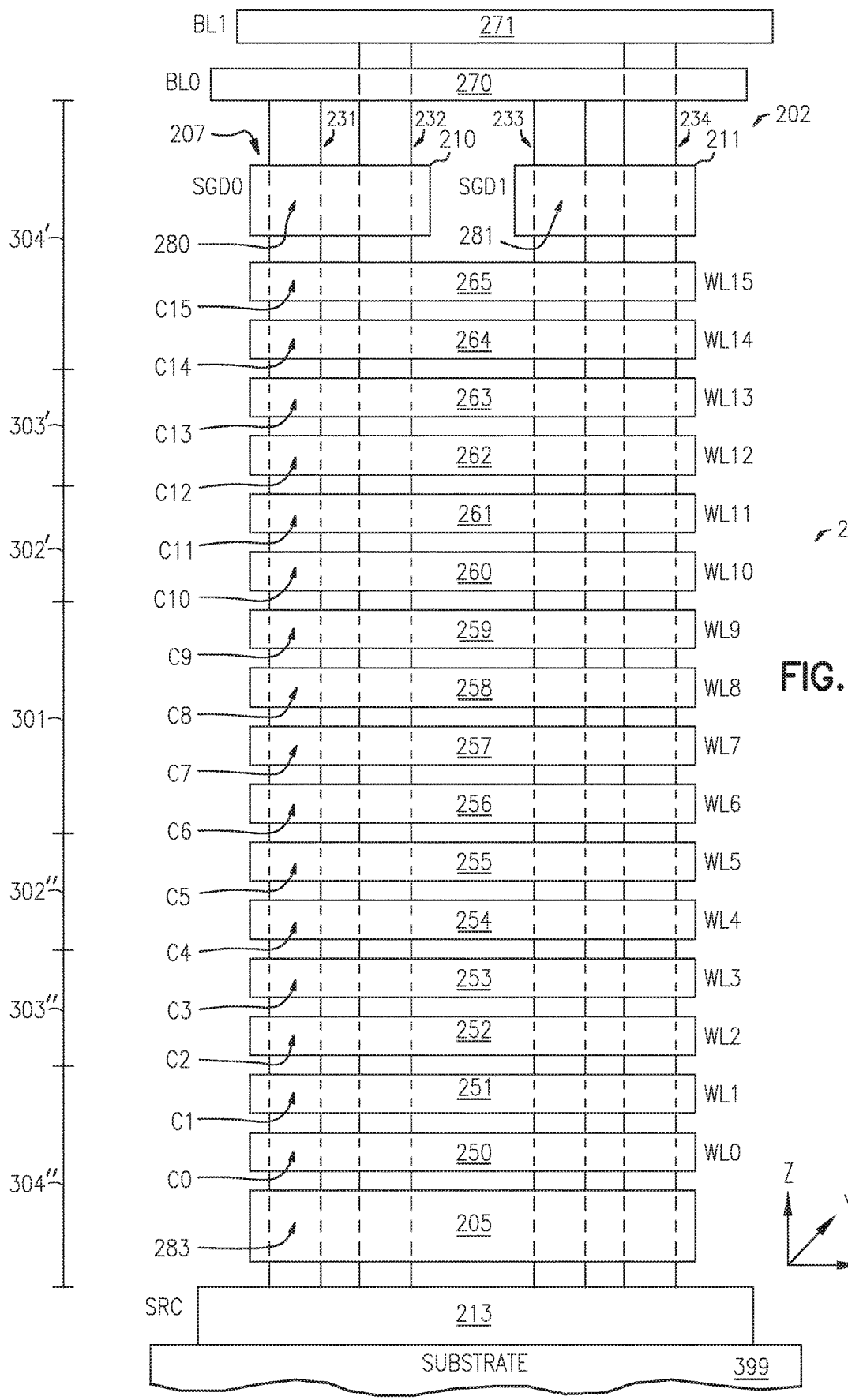
FIG. 3 shows a representation of side view of a portion of a structure of the memory device of FIG. 2, according to some embodiments of the invention.

FIG. 3 shows a representation of side view of a portion of a structure of memory device 200 of FIG. 2, according to some embodiments of the invention. For simplicity, FIG. 3 shows only two data lines 270 and 271 and four memory cell strings (including memory cell string 207) of FIG. 2. Other data lines and memory cell strings of memory device 200 of FIG. 2 are omitted from FIG. 3.

As shown in FIG. 3, memory device 200 can include a substrate 399, which can include a semiconductor material (e.g., silicon). Memory array 202 (which includes memory cells C0 through C15) can be formed over substrate 399. For simplicity, only memory cell C0 through C15 of memory cell string 207 are labeled in FIG. 3.

Memory cells C0 through C15 and part of access lines 250 through 265 can be located in different levels of memory device 200. For example, access line 250 and memory cells C0 can be located in (e.g., formed in) one level of memory device 200, access line 251 and memory cells C1 can be located in (e.g., formed in) another level of memory device 200, and so on for other access lines and associated other memory cells (e.g., memory cells C2 through C15) of memory device 200, as shown in FIG. 3.

Access lines 250 through 265, data lines 270 and 271, and select lines 210, 211, and 280, can include a conductive material (or materials). Example materials for access lines 250 through 265 include conductively doped polysilicon, metal, or other conductive materials. Source (e.g., source line) 213 can include a conductive material formed in or formed on substrate 399. FIG. 3 shows an example where source 213 is formed on substrate 399 as an example. However, source 213 can be formed in substrate 399 (e.g., formed as a doped region in substrate 399).

Each of memory cells C0 through C15 can include a charge storage structure (e.g., a memory element) that can be configured to store information (e.g., data). The charge storage structure of each of memory cells C0 through C15 can include a piece of polysilicon to store information, piece of dielectric material (e.g., silicon nitride) to store information, or other materials configured to store (e.g., to hold (e.g., trap) charge to store information. The value of the information stored in a particular memory cell of memory cells C0 C15 can be based on the amount of charge in the charge storage structure of that particular memory cell.

FIG. 3 also shows four pillars 231, 232, 233, and 234 associated with four memory cell strings of memory device 200. Each of pillars 231, 232, 233, and 234 can contain materials (e.g., a hole filled with materials) extending in the Z-direction and contact source 213 and one of the data lines (e.g., data line 270 and or data line 271) of memory device 200. Each of pillars 231, 232, 233, and 234 can extend through access lines 250 through 265 and through memory cells C0 through C15 of a respective memory cell string. At least one of the materials in a respective pillar can include a conductive material (or conductive materials) configured to form a conductive structure (e.g., a continuous conductive channel) to conduct current between source 213 and one of data lines 270, 271, and 272 during an operation (e.g., erase, write, or read operation) of memory device 200.

FIG. 3 shows pillar 231 including different portions (continuous conductive portions with respect to the Z-direction) between data line 270 and source 213, including portions 301, 302', 302'', 303', 303'', 304', and 304''. Portion 301 can be approximately at the middle of pillar 231. Thus, portion 301 can be viewed as middle portion of pillar 231. Other portions (e.g., 302', 302'', 303', 303'', 304', and 304'') are located on both sides of the middle portion. For example, portions 302', 303', and 304' are located on one side (e.g., data line 270 side) of portion 301, and portions 302'', 303'', and 304'' are located on another side (e.g., source 213 side) of portion 301.

As shown in FIG. 3, memory cells C0 through C15 of memory cell string 207 can be located along different portions of pillar 231. Access lines 250 through 265 (e.g., the material of a portion of each of access lines 250 through 265) can also be located along a different portion of pillar 231.

Memory cells C0 through C15 of memory cell string 207 and respective access lines 250 through 265 (which are the access lines that are used to access memory cells C0 through C15, respectively) can be located along the same portion of pillar 231. For example, memory cells C6 through C9 and access lines 256 through 259 can be located along the same portion (e.g., portion 301) of pillar 231; memory cells C10 and C11 and access lines 260 and 261 can be located along the same portion (e.g., portion 302') of pillar 231; memory cells C12 and C13 and access lines 262 and 263 can be located along the same portion (e.g., portion 303') of pillar 231; and memory cells C14 and C15 and access lines 264 and 265 can be located along the same portion (e.g., portion 304') of pillar 231.

In another example, memory cells C4 and C5 and access lines 254 and 255 can be located along the same portion (e.g., portion 302'') of pillar 231; memory cells C2 and C3 and access lines 252 and 253 can be located along the same portion (e.g., portion 303'') of pillar 231; and memory cells C0 and C1 and access lines 250 and 251 can be located along the same portion (e.g., portion 304'') of pillar 231.

In operation (e.g., in a read, write, or erase operation), memory device 200 can apply different voltages on data lines 270 and 271, select lines 210 and 211, access lines 250 through 265, select line 205, and source 213. The voltages used in one operation (e.g., a write operation) can be different from the voltages used in another operation (e.g., a read operation). Depending on which memory cell among memory cells C0 through C15 is a selected memory cell (e.g., to store information in the selected memory cell or read information from the selected memory cell), access lines 250 through 265 can be applied with voltages having different values.

In a write operation of memory device 200, a program voltage (e.g., Vprg=20V) can be applied to a selected access line (which is coupled to a selected memory cell) to store (e.g., program) information in a selected memory cell. Another voltage (e.g., a pass voltage Vpass_write=10V) can be applied to unselected access lines (which are coupled to unselected memory cells). For example, if memory cell string 207 is selected and memory cell C14 is selected (memory cells C0 through C13 and C15 are unselected memory cells) in a write operation, then a program voltage (e.g., Vprg=20V) can be applied to access line 264 (a selected access line in this example), and another voltage (e.g., Vpass_write=10V) can be applied to access lines 250 through 263 and 265 (unselected access lines in this example). The select line (e.g., select line 210) coupled the selected memory cell string (which includes the selected memory cell) can be applied with a positive voltage (e.g., 5V). The select line (e.g., select line 211) coupled to unselected memory cell strings can be applied with 0V. Select line 205 can be applied with 0V. The data line (e.g., data line 270 in the example write operation) coupled to the selected memory cell string (which includes the selected memory cell) can be applied with 0V. Other data lines (e.g., data line 271) can be applied with a positive voltage (e.g., 2V). Source 213 can be applied with a positive voltage (e.g., 2V).

In a read operation of memory device 200, a read voltage (e.g., Vread=1V) can be applied to a selected access line (which is coupled to a selected memory cell) to read (e.g., sense) information from a selected memory cell. Another voltage (e.g., a pass voltage Vpass_read=8V) can be applied to unselected access lines (which are coupled to unselected memory cells). For example, if memory cell string 207 is selected and memory cell C14 is selected (memory cells C0 through C13 and C15 are unselected memory cells) in a read operation, then a read voltage (e.g., Vread=1V) can be applied to access line 264 (a selected access line in this example), and another voltage (e.g., Vpass_read=8V) can be applied to access lines 250 through 263 and 265 (unselected access lines in this example). The select line (e.g., select line 210) coupled the selected memory cell string (which includes the selected memory cell) can be applied with a positive voltage (e.g., 5V). The select line (e.g., select line 211) coupled unselected memory cell strings can be applied with 0V. Select line 205 can be applied with a positive voltage (e.g., 5V). The data line (e.g., data line 270 in the example read operation) coupled the selected memory cell string (which includes the selected memory cell) can be applied with a positive voltage (e.g., 0.3V). Other data lines (e.g., data line 271) can be applied with a positive voltage (e.g., 0.3V). Source 213 can be applied with 0V.

In an erase operation of memory device 200, an erase voltage (e.g., Verase=20V) can be applied to data lines (e.g., data lines 270, 271, and 272 in FIG. 2) of a block of memory cells of memory device 200 (e.g., the block that includes the string of memory cells C0 through C15 coupled to data lines 270, 271, and 272) to erase information from that block of memory cells. The erase voltage can also be applied to source 213. A positive voltage (e.g., 15V) can be applied to select lines 205, 210, and 211. Zero volts can be applied to access lines 250 through 265 (e.g., access lines 250 through 265 can be coupled to ground node 290).

Figure 4:
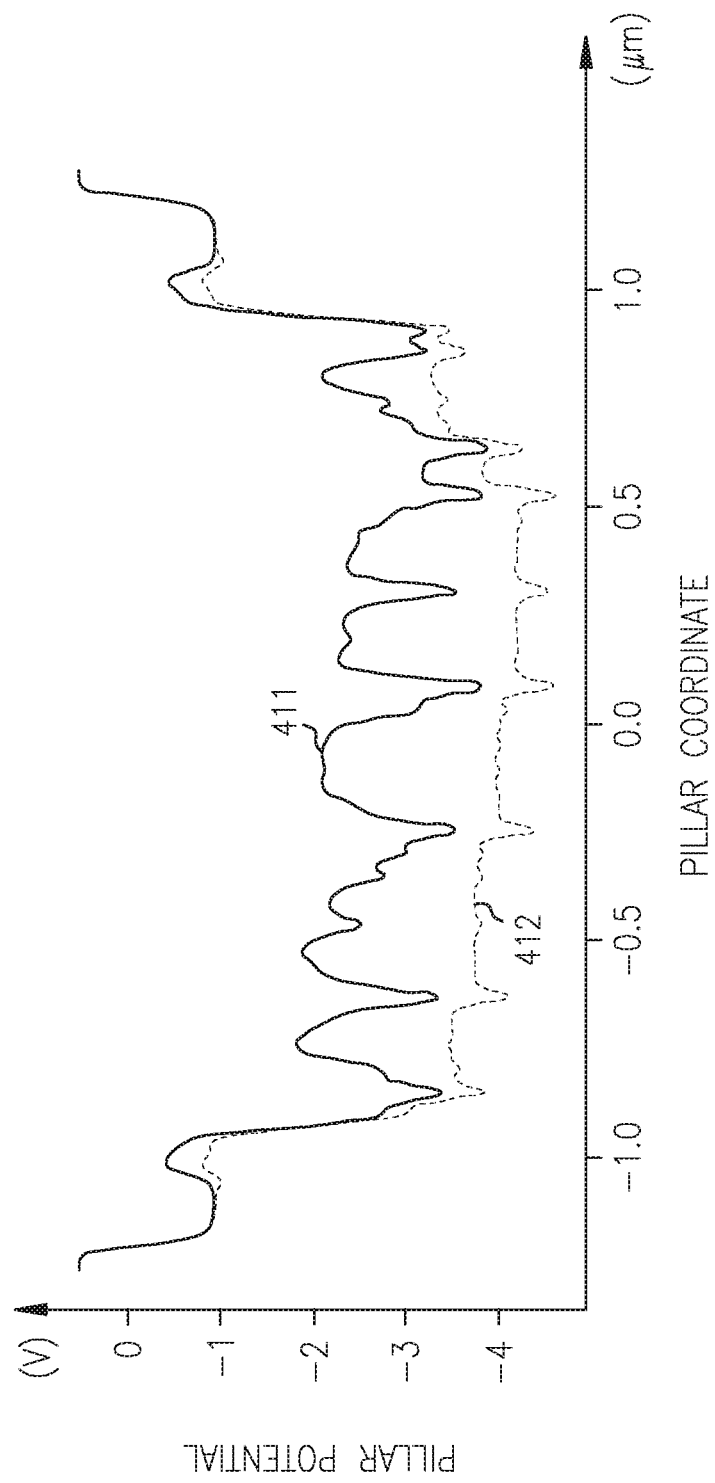
FIG. 4 is a graph showing different curves that represent examples of pillar potential at different locations of a pillar of the memory device of FIG. 3 with and without a sequential ramp-down operation being performed, according to some embodiments of the invention.

FIG. 4 is a graph showing curve 411 and curve 412 that represent examples of pillar potential at different locations of pillar 231 of memory device 200 of FIG. 3 with a sequential ramp-down operation being performed and without a sequential ramp-down operation being performed, respectively, according to some embodiments of the invention. In FIG. 4, the coordinates in the horizontal axis correspond to relative locations of pillar 231 in FIG. 3. Other pillars (e.g., pillars 232, 233, and 234) of memory device 200 can have similar pillar potential as that of pillar 231 shown in FIG. 4.

Coordinate zero ("0") in FIG. 4 can correspond to a location near the middle (or at the middle) of pillar 231. For example, coordinate zero can correspond to the location of pillar 231 that is adjacent the location between memory cells C7 and C8.

Coordinate −1 in FIG. 4 can correspond to the location of pillar 231 that is near the location of memory cell C0. Coordinate −0.5 in FIG. 4 can correspond to the location of pillar 231 that is between the locations of memory cells C0 and C7. Coordinate 1 in FIG. 4 can correspond to the location of pillar 231 that is near the location of memory cell C15. Coordinate 0.5 in FIG. 4 can correspond to the location of pillar 231 that is between the locations of memory cells C7 and C15. Thus, coordinate zero can correspond to a middle location (e.g., middle portion) of pillar 231. Coordinate −1 can correspond to the location (e.g., end portion) of pillar 231 on the source 213 side. Coordinate 1 can correspond to the location (e.g., end portion) of pillar 231 on data line (e.g., data line 270) side.

In FIG. 4, curve 412 can represent a situation where the voltages on access lines 250 through 265 are simultaneously decreased from a positive value to 0V (e.g., simultaneously coupled to ground) after an operation (e.g., a read operation) of memory device 200. In this situation, the potential of pillar 231 between coordinates −1 and 1 can have a relatively high negative potential (e.g., approximately −4 volts, as shown in FIG. 4). The high negative potential of pillar 231 may be caused by some of the memory cells of memory device 200 (e.g., memory cells C0, C1, C14, and C15) near both ends of pillar 231 (e.g., near source 213 and near data line 270) that may have relatively high threshold voltage (e.g., high level cells).

The relatively higher negative potential in pillar 231 can cause some particular memory cells of memory device 200 (e.g., lower level memory cells) along pillar 231 to accumulate charge from pillar 231. This can lead to a slow read disturb in these particular memory cells. The relatively higher negative potential in pillar 231 can also cause trap generation in some other memory cells of memory device 200 (e.g., higher level memory cells) along pillar 231.

Curve 411 represents the potential of pillar 231 when the voltages on access lines 250 through 265 are sequentially ramped down (e.g., not simultaneously ramped down) from a positive value to 0V. An example ramp-down operation of memory device 200 is described in more detail below with reference to FIG. 5. The sequential ramp-down operation can help lower level memory cells of memory device 200 to obtain a lower negative channel boost and higher level memory cells of memory device 200 to obtain a higher negative channel boost, thereby avoiding the slow read disturb and trap generation. Other improvement and benefits of the sequential ramp down operation are mentioned above.

Figure 5:
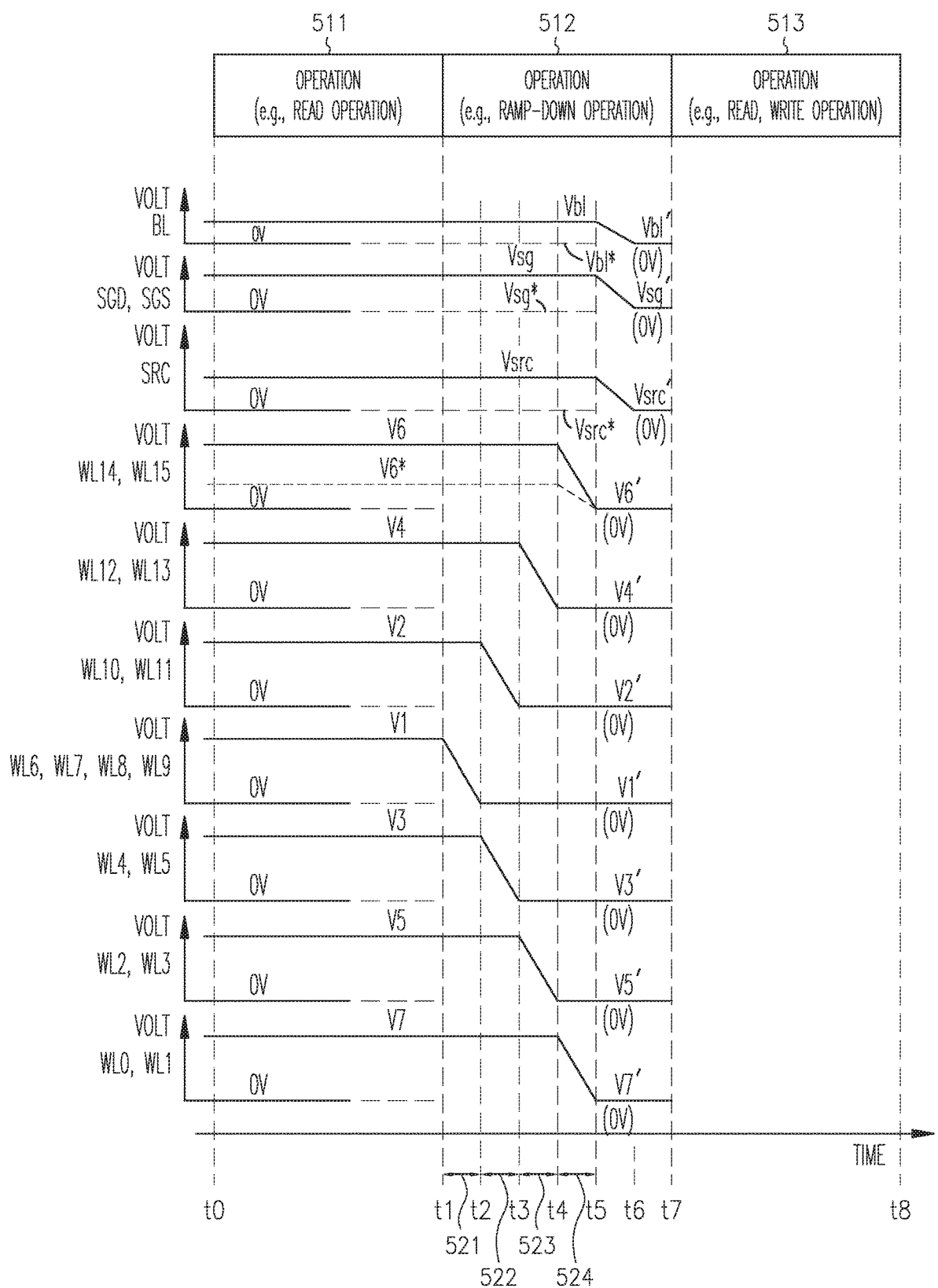
FIG. 5 is an example timing diagram showing waveforms of the signals of the memory device of FIG. 2 and FIG. 3 including signals on access lines of the memory device during example operations including a sequential ramp-down operation of the memory device, according to some embodiments of the invention.

FIG. 5 is an example timing diagram showing waveforms of the signals of memory device 200 of FIG. 2 and FIG. 3 including signals on access lines 250 through 265 during example operations including a sequential ramp-down operation of memory device 200, according to some embodiments of the invention. In FIG. 5, times t0 through t8 (on horizontal axis) are different points in times where time t0 occurs before time t1, time t1 occurs before time t2, and so on. FIG. 5 also show time intervals 521, 522, 523, and 524 between times t1 and t5. Time interval 521 occurs before time interval 522, time interval 522 occurs before time interval 523, and time interval 523 occurs before time interval 524.

As shown in FIG. 5, memory device 200 can include different operations 511, 512, and 513 that can be performed in an order shown in FIG. 5. For example, memory device 200 can perform operation 512 after operation 511, and operation 513 after operation 512. Operation 511 can be performed between times t0 and t1, operation 512 can be performed during between times t1 and t7, and operation 513 can be performed between times t7 and t8.

Operation 511 can be a read operation (or part of a read operation) to sense (e.g., read) information from a selected memory cell of a memory cell string (e.g., memory cell string 207) and provide the information to an I/O circuit (e.g., similar to I/O circuit 116) of memory device 200. Operation 511 can be a write operation (or verify stage of a write operation) to sense (e.g., read) information from a selected memory cell of a memory cell string (e.g., memory cell string 207) to determine whether information being stored in a selected memory cell reaches a target value during a write operation). Operation 511 can be an erase operation (or part of an erase operation) to erase information from selected memory cells of memory device 200 (e.g., from a block of memory cells of memory device 200 that include memory cell string 207). Operation 511 can be other operations of memory device 200. Similarly, operation 513 can be a read operation (or part of a read operation), a write operation (or part of a write operation (e.g., a write verify stage a write operation)), an erase operation (or part of an erase operation), or another operation of memory device 200.

Memory device 200 can perform operation (e.g., ramp-down operation) 512 between operations 511 and 513 to influence (e.g., adjust) the potential of pillar 231 in FIG. 3, such that pillar 231 can have relatively lower negative potential. For example, operation 512 can cause pillar 231

(and other pillars (e.g., pillars 232, 233, and 234) of memory device 200) to have a potential similar to the potential represented by curve 411 of FIG. 4. The time interval between times t1 and t7 in FIG. 5 (where operation 512 is performed) can be an idle state of memory device 200 (e.g., a state where memory device 200 may not perform a read operation, a write operation, or erase operation). Advantages and benefits of performing operation 512 to cause the pillars (e.g., pillars 231, 232, 233, and 234) of memory device 200 to have a relatively lower negative potential is discussed above.

FIG. 5 shows operation 512 as an operation separate from operations 511 and 513. However, operation 512 can be part of operation 511. For example, operation 512 can be the last stage performed after a sensing stage (e.g., read stage) of operation 511 if operation 511 is a read operation. In another example, operation 512 can be the last stage performed before a sensing stage (e.g., write verify stage) of operation 511 if operation 511 is a write operation. In another example, operation 512 can be the last stage performed after an erase stage of operation 511 if operation 511 is an erase operation.

Alternatively, operation 512 can be part of operation 513. For example, operation 512 can be the beginning stage performed before a sensing stage (e.g., read stage) of operation 513 if operation 513 is a read operation. In another example, operation 512 can be the beginning stage performed before a sensing stage (e.g., write verify stage) of operation 513 if operation 513 is a write operation. In another example, operation 512 can be the beginning stage performed before an erase stage of operation 513 if operation 513 is an erase operation.

The signals shown in FIG. 5 correspond to the signals shown in FIG. 2 and FIG. 3. In FIG. 5, signal BL can represent each of signals BL0, BL, and BL2 of FIG. 2 and FIG. 3. Signal SGD in FIG. 5 can represent each of signals SGD0 and SGD1 of FIG. 2 and FIG. 3. Signal SRC in FIG. 5 is the same as signal SRC of FIG. 3. Signals WL0 through WL15 are the same signals applied to access lines 250 through 265, respectively (FIG. 3).

FIG. 5 shows values (e.g., amplitude voltage values in volt unit) of voltages provided to signals WL0 through WL15, including values V1 through V7, V1' through V7', and V6*. Other values (voltage values) of voltages provided to signals BL, SGD, SGS, and SRC include Vsg, Vsg', Vsg*, Vbl, Vbl*, Vbl', Vsrc, Vsrc*, and Vsrc'.

Each of values V1 through V7, V6*, Vbl, and Vsrc can be a positive value (each of V1 through V7>0V, V6*>0V, Vbl>0V, and Vsrc>0V). As described above with reference to FIG. 3, voltage Vread and Vpass_read can be selectively applied to access line 250 through 265 during a read operation of memory device 200. In FIG. 5, if operation 511 is a read operation, then each of values V1 through V7 can be similar to or the same as the value of voltage Vpass_read (e.g., V1=8V, V2=8V, . . . , V7=8V), and value V6* can be the value of voltage Vread (e.g., V6*=1V).

Each of values Vbl, Vsg, and Vsrc can be a positive value. For example, each of value Vbl and value Vsrc can greater than 0V and less than 1V, and value Vsg can be 5V.

Each of values V1' through V7', Vbl*, Vsg*, and Vsrc* can be 0V (e.g., the voltage value of ground node 290).

The specific voltage values described in this description are example values. However, other values (e.g., other positive values different from the example values) can be used.

FIG. 5 shows two different values V6 and V6* for signals WL14 and WL15 to indicate that signals WL14 and WL15 can be provided with voltages having different values (e.g., V6=8V and V6*=1V). For example, if operation 511 is a read operation (or alternatively a verify stage of a write operation) and if memory cell C14 is selected during operation 511, then the voltage provided to signal WL14 (on access line 264 used to access memory cell C14) can have value V6* between times T0 and T4, and the voltage provided to signal WL15 can have value V6 between times T0 and T4. However, if memory cell C15 (instead of memory C14) is selected in this example, then the voltage provided to signal WL15 (on access line 265 used to access memory cell C15) can have value V6* (instead of value V6) between times T0 and T4, and the voltage provided to signal WL14 can have value V6 (instead of value V6*) between times T0 and T4.

In an alternative operation, memory device 200 can operate such that during operation 512, both signals WL14 and WL15 in FIG. 5 can be provided with voltages having the same value (e.g., value V6) for at least a portion of the time interval between times t0 and t4. For example, signal WL14 can be provided with a voltage having value V6 between times t1 and t4, and signal WL14 can also be provided with a voltage having value V6 between times t1 and t4.

FIG. 5 shows two values Vbl and Vbl* between times t1 and t6 for signal BL to indicate that signal BL can be provided with (e.g., bias with) a voltage having either value Vbl (e.g., a positive value) and or value Vbl* (e.g., 0V) between times t1 and t6. Similarly, FIG. 5 shows two values Vsg and Vsg* between times t1 and t6 for signal SGD, SGS to indicate that each of signal SGD and SGS can be provided with a voltage having either value Vsg (e.g., a positive value) and or value Vsg* (e.g., 0V) between times t1 and t6. FIG. 5 shows two values Vsrc and Vsrc* between times t1 and t6 for signal SRC to indicate that signal SRC can be provided with (e.g., bias with) a voltage having either value Vsrc (e.g., a positive value) and or value Vsrc* (e.g., 0V) between times t1 and t6.

In the above examples, any combination of values Vbl (or alternatively Vbl*), Vsg (or alternatively Vsg*), and Vsrc (or alternatively (Vsrc*) can be used for the voltages provided signals BL, SGD (or SGS), and SRC, respectively, between times t1 and t6 (e.g., during part of operation 512)

The following description refers to FIG. 2, FIG. 3, and FIG. 5. During operation 512 (FIG. 5), memory device 200 can sequentially decrease (sequentially ramp down) the values (e.g., from V1 through V7 to V1' through V7', respectively) of the voltages on access lines 250 through 265 (FIG. 3) at different time intervals (e.g., time intervals 521, 522, 523, and 524 in FIG. 5). For example, operation 512 can begin (e.g., begin during time interval 521) the sequential voltage decrement by decreasing the values of the voltages on middle access lines (e.g., access lines associated with signals WL6, WL7, WL8, and WL9) that have portions located (physically located) at the middle of pillar 231 (FIG. 3). Then, operation 512 can continue (e.g., during each of time intervals 521, 522, 523, and 524 in FIG. 5) the sequential voltage decrement by selectively decreasing the voltages on the access lines that have portions located (physically located) along pillar 231 on both sides of the middle access lines, as described in detail below.

During time interval 521 (FIG. 5), memory device 200 can decrease the values of voltages on access lines 256, 257, 258, and 259 (having signals WL6, WL7, WL8, and WL9, respectively) from value V1 (e.g., a positive value) to value V1' (e.g., 0V). Decreasing the value of the voltage on access lines 256, 257, 258, and 259 during time interval 521 can include coupling access lines 256, 257, 258, and 259 to ground node 290 (e.g., through four respective transistors of driver circuitry 227 (that are turned on) and four respective conductive lines (among conductive lines 220 through 235) that are coupled to ground node 290. During time interval 521, access lines 250 through 265, except for access lines 256, 257, 258, and 259, can be coupled to (or remain coupled to) a positive voltage through respective transistors of driver circuitry 227 (that are turned on) and respective conductive lines (among conductive lines 220 through 235) that are coupled to a positive voltage (e.g., one of voltages VA, VB, and VC in FIG. 2).

During time interval 522 (FIG. 5), memory device 200 can decrease the values of the voltages on access lines 260 and 261 (having signals WL0 and WL11, respectively) from value V2 (e.g., a positive value) to value V2' (e.g., 0V). During time interval 522, memory device 200 can also decrease the values of the voltages on access lines 254 and 255 (having signals WL4 and WL5, respectively) from value V3 (e.g., a positive value) to value V3' (e.g., 0V). Decreasing the value of the voltage on access lines 254, 255, 260, and 261 during time interval 522 can include coupling access lines 254, 255, 260, and 261 to ground node 290 (e.g., through four respective transistors of driver circuitry 227 (that are turned on) and four respective conductive lines (among conductive lines 220 through 235) that are coupled to ground node 290. During time interval 522, access lines 250 through 265, except for access lines 256, 257, 258, and 259 (coupled to ground node 290 during time interval 521) and access lines 254, 255, 260, and 261 (coupled to ground node 290 during time interval 522), can be coupled to a positive voltage through respective transistors of driver circuitry 227 (that are turned on) and respective conductive lines (among conductive lines 220 through 235) that are coupled to a positive voltage (e.g., one of voltages VA, VB, and VC in FIG. 2).

During time interval 523 (FIG. 5), memory device 200 can decrease the values of the voltages on access lines 262 and 263 (having signals WL12 and WL13, respectively) from value V4 (e.g., a positive value) to value V4' (e.g., 0V). During time interval 523, memory device 200 can also decrease the values of the voltages on access lines 252 and 253 (having signals WL2 and WL3, respectively) from value V5 (e.g., a positive value) to value V5' (e.g., 0V). Decreasing the value of the voltage on access lines 252, 253, 262, and 263 during time interval 523 can include coupling access lines 252, 253, 262, and 263 to ground node 290 (e.g., through four respective transistors of driver circuitry 227 (that are turned on) and four respective conductive lines (among conductive lines 220 through 235) that are coupled to ground node 290. During time interval 523, access lines 250 through 265, except for access lines 256, 257, 258, and 259 (coupled to ground node 290 during time interval 521), access lines 254, 255, 260, and 261 (coupled to ground node 290 during time interval 522), and access lines 252, 252, 262, and 263 (coupled to ground node 290 during time interval 523), can be coupled to a positive voltage through respective transistors of driver circuitry 227 (that are turned on) and respective conductive lines (among conductive lines 220 through 235) that are coupled a positive voltage (e.g., one of voltages VA, VB, and VC in FIG. 2).

During time interval 524 (FIG. 5), memory device 200 can decrease a value of the voltage on access lines 264 and 265 (having signals WL14 and WL15, respectively) from value V6 (e.g., a positive value) to value V6' (e.g., 0V). During time interval 524, memory device 200 can also decrease a value of the voltage on access lines 250 and 251 (having signals WL0 and WL1, respectively) from value V7 (e.g., a positive value) to value V7' (e.g., 0V). Decreasing the value of the voltage on access lines 250, 251, 264, and 265 during time interval 524 can include coupling access lines 250, 251, 264, and 265 to ground node 290 (e.g., through four respective transistors of driver circuitry 227 (that are turned on) and four respective conductive lines (among conductive lines 220 through 235) that are coupled to ground node 290. During time interval 524, access lines 250 through 265, except for access lines 256, 257, 258, and 259 (coupled to ground node 290 during time interval 521), access lines 254, 255, 260, and 261 (coupled to ground node 290 during time interval 522), access lines 252, 253, 262, and 263 (coupled to ground node 290 during time interval 523), and access lines 250, 251, 264, and 265 (coupled to ground node 290 during time interval 524), can be coupled to a positive voltage through respective transistors of driver circuitry 227 (that are turned on) and respective conductive lines (among conductive lines 220 through 235) that are coupled a positive voltage (e.g., one of voltages VA, VB, and VC in FIG. 2).

FIG. 5 shows an example operation 512 of memory device 200 where the voltage on an access line (or voltages on a group of access lines) can start to be decreased when (e.g., after the time) the voltage on another access line (or voltages on a group of other access lines) reaches zero volts (e.g., reaches ground potential). In an alternative operation of memory device 200, the voltage on an access line (or voltages on a group of access lines) can start to be decreased before the voltage on another access line (or voltages on a group of access lines) reaches zero volts (e.g., reaches ground potential).

For example, in FIG. 3 and FIG. 5, the voltages on access lines 254, 255, 260, and 261 (associated with signals WL4, WL5, WL10, and WL11, respectively) can start to be decreased (e.g., decreased from respective values V2 and V3) before time t2 (e.g., and not at time t2) and after time t1 while the voltages on access lines 256, 257, 258, and 259 (associated with signals WL6, WL7, WL8, and WL9, respectively) have not reached value V1' (e.g., zero volts).

In another example, in FIG. 3 and FIG. 5, the voltages on access lines 252, 253, 262, and 263 (associated with signals WL2, WL3, WL12, and WL13, respectively) can start to be decreased (e.g., decreased from respective values V4 and V5) before time t3 (e.g., and not at time t3) and after time t2 while the voltages on access lines 254, 255, 260, and 261 (associated with signals WL4, WL5, WL10, and WL11, respectively) have not reached respective values V2' and V3'(e.g., zero volts).

In another example, in FIG. 3 and FIG. 5, the voltages on access lines 250, 251, 264, and 265 (associated with signals WL0, WL1, WL14, and WL15, respectively) can start to be decreased (e.g., decreased from respective values V6 and V7) before time t4 (e.g., and not at time t4) and after time t3 while the voltages on access lines 252, 253, 262, and 263 (associated with signals WL2, WL3, WL12, and WL13, respectively) have not reached respective values V4' and V5'(e.g., zero volts).

FIG. 5 shows an example where access lines 250 through 265 are divided into four groups (for purposes of the sequential ramp-down operation): a group including access lines access lines 256, 257, 258, and 259 (coupled to a corresponding memory cell group including memory cells C6, C7, C8, and C9), a group including access lines access lines 254, 255, 260, and 261 (coupled to a corresponding memory cell group including memory cells C4, C5, C10, and C11), a group including access lines access lines 252, 253, 262, and 263 (coupled to a corresponding memory cell group including memory cells C2, C3, C12, and C13), and a group including access lines access lines 250, 251, 264, and 265 (coupled to a corresponding memory cell group including memory cells C0, C1, C14, and C15). However, the number of groups of access lines 250 through 265 can be different from four for purposes of the sequential ramp-down operation. For example, access lines 250 through 265 may be divided into three groups that include a middle group and two additional groups one on each side of the middle group. In another example, access lines 250 through 265 may be divided into more than four groups.

FIG. 5 shows an example where each of the groups (e.g., each of the four groups mentioned above) of access lines 250 through 265 includes an equal number (e.g., four) of access lines. However, the number of access lines can also be different from one group to another.

Further, FIG. 5 shows an example each of the groups (e.g., each of the four groups mentioned above) of access lines 250 through 265 includes multiple access lines (e.g., four access lines). However, each of the groups of access lines 250 through 265 can have only one access line (e.g., a single access line). Alternatively, fewer than all of the groups of access lines 250 through 265 (some but not all of the groups) of access lines 250 through 265) can have only one access line (e.g., a single access line).

Figure 6:
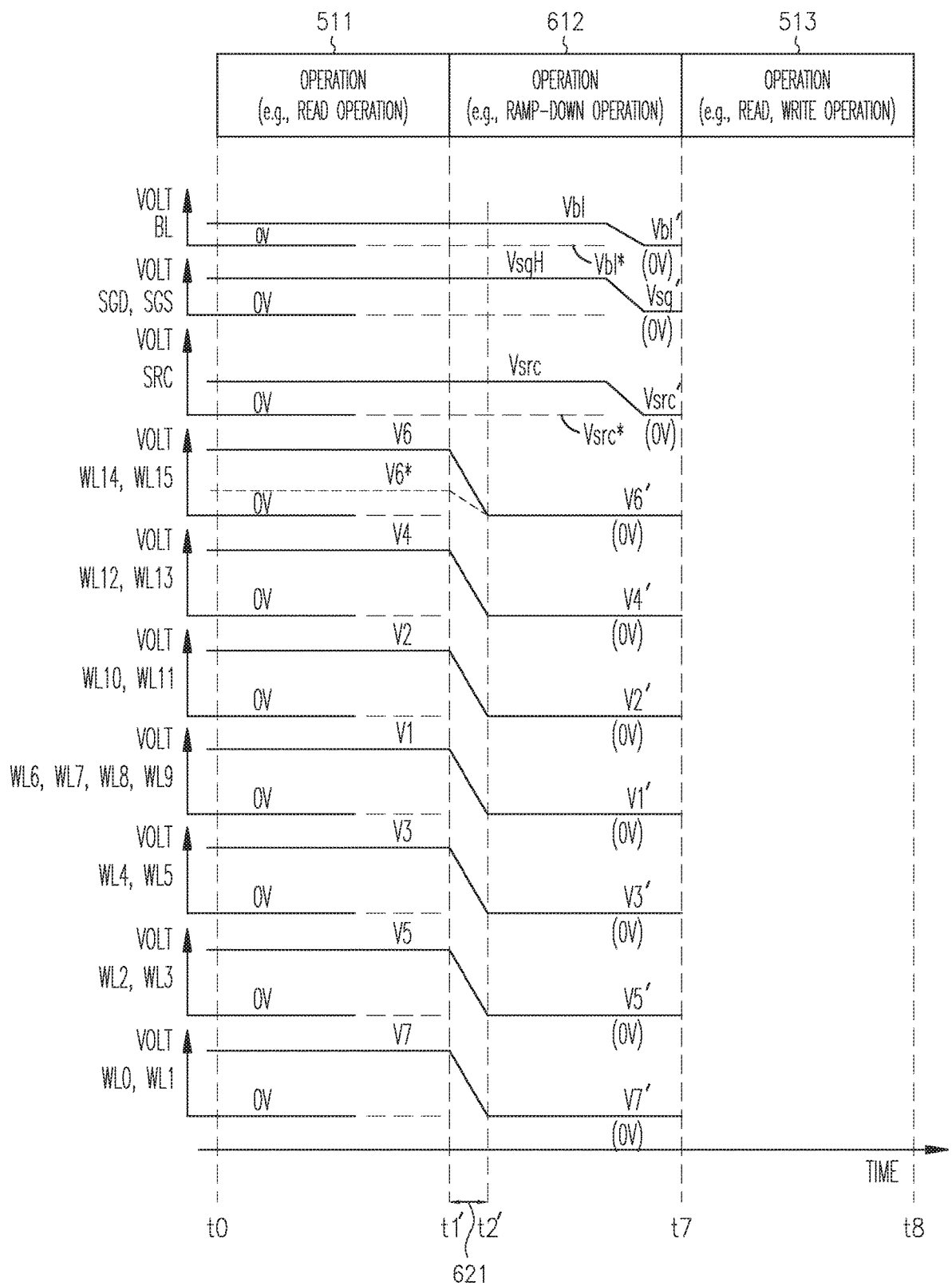
FIG. 6 is an example timing diagram showing waveforms of the signals of the memory device of FIG. 2 and FIG. 3 including signals on select lines and access lines during alternative operations including a ramp-down operation of the memory device, according to some embodiments of the invention.

FIG. 6 is an example timing diagram showing waveforms of the signals of memory device 200 of FIG. 2 and FIG. 3 including signals on select lines and access lines 250 through 265 during alternative operations including a ramp-down operation of memory device 200, according to some embodiments of the invention. Operations 511 and 513 of FIG. 6 can be similar to or the same as operation 511 and 513, respectively, of FIG. 5. Differences between FIG. 5 and FIG. 5 include operation 612 of FIG. 6.

As shown in FIG. 6 during operation 612, memory device 200 can apply a voltage having a value VsgH, which is greater than zero (e.g., VsgH=5V) to signals SGD and SGS during a time interval 621 (e.g. between times t1' and t2'). The voltage on signals SGD and SGS can be decreased to Vsg' (e.g., 0V) after time t2' and before operation 513 is performed. As described above, signal SGD presents signals SGD0 and SGD1 applied to select lines 210 and 211, respectively, in FIG. 3, and signal SGS presents signal SGS applied to select lines 205 in FIG. 3. During operation 612, memory device 200 can decrease (e.g., simultaneously decreases) the values of voltages on the access lines from V1 through V7 to V1' through V7', respectively, during time interval 621 while the voltage having value VsgH is applied to signal SGD and SGS. Other signals (e.g., BL and SRC) of memory device 200 can be provided with voltages similar to or the same as that of FIG. 5.

Operation 612 of FIG. 6 can cause the pillars (e.g., pillars 231, 232, 233, and 234 (FIG. 3) to have relatively lower negative potential. However, the effectiveness of operation 612 strongly depends on the pattern (e.g., program-erase pattern) of the values of information stored in the memory cell string. Operation 612 may not completely remove the negative the potential in the pillar. Further, unlike operation 512 of FIG. 5, operation 612 of FIG. 6 lacks the selective adjustment of pillar potential according to program level of the memory cells. Therefore, although operation 612 can cause the pillars to have a relatively lower negative potential, the improvements and benefits of operation 612 may not be the same as that of operation 512 described above with reference to FIG. 2 through FIG. 5.

Figure 7:
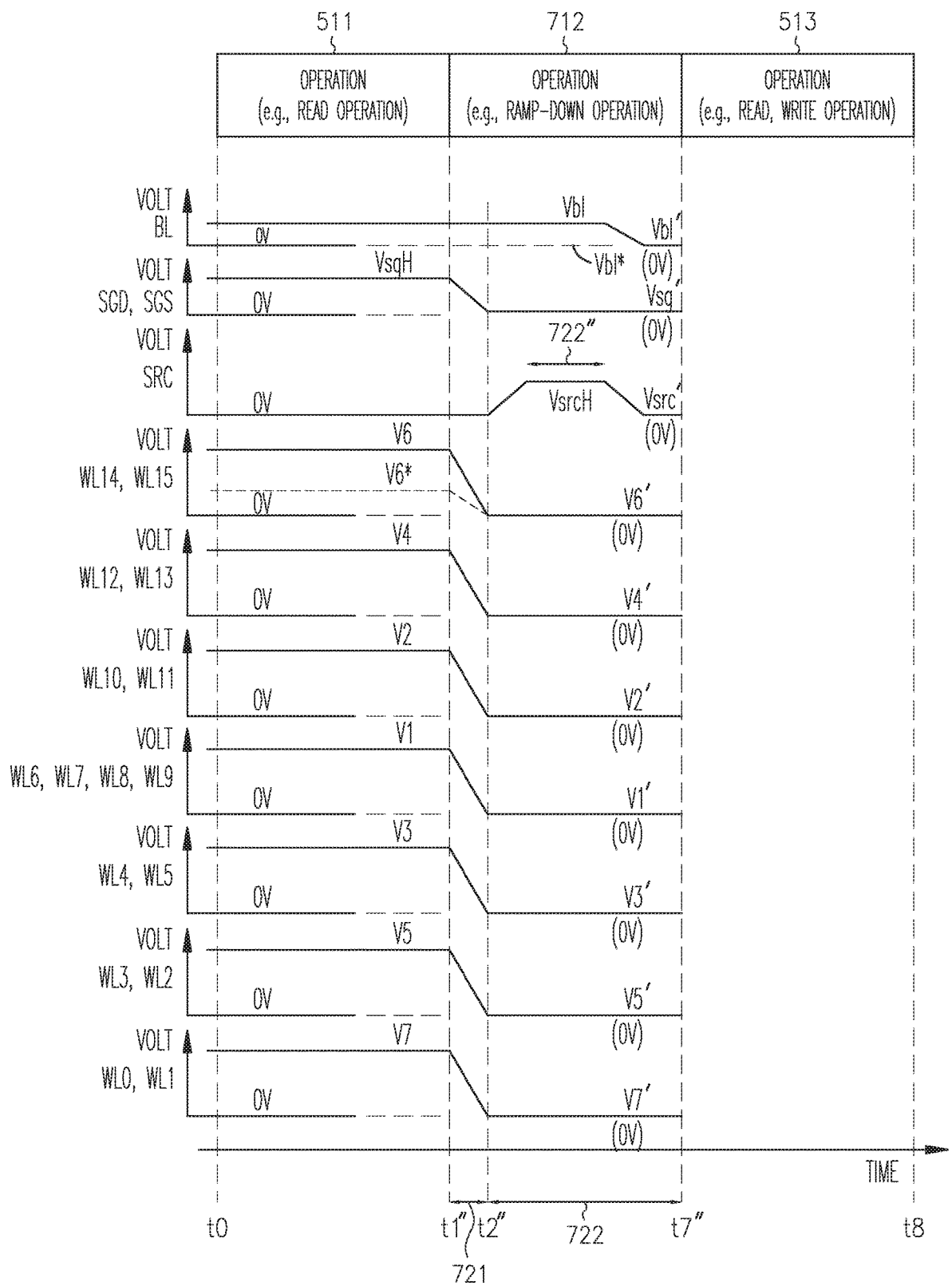
FIG. 7 is an example timing diagram showing waveforms of the signals of the memory device of FIG. 2 and FIG. 3 including signals on a source and access lines during alternative operations including a ramp-down operation of the memory device, according to some embodiments of the invention.

FIG. 7 is an example timing diagram showing waveforms of the signals of memory device 200 of FIG. 2 and FIG. 3 including signals on source 213 and access lines 250 through 265 during alternative operations including a ramp-down operation of memory device 200, according to some embodiments of the invention. Operations 511 and 513 of FIG. 7 can be similar to or the same as operation 511 and 513, respectively, of FIG. 5. Differences between FIG. 7 and FIG. 5 include operation 712 of FIG. 7.

As shown in FIG. 7 during operation 712, memory device 200 can decrease a voltage having a value VsgH, which is greater than zero (e.g., VsgH=5V), on signal SGD and SGS during a time interval 721 (e.g., between times t1" and t2"). For example, memory device 200 can couple each of lines 205, 210, and 211 (FIG. 3) to a ground potential (e.g., to ground node 290) during time interval 721. The voltage on signal SGD and SGS can reach value Vsg' (e.g., 0V) after time t2". During operation 712, memory device 200 can decrease (e.g., simultaneously decreases) the values of voltages on the access lines from V1 through V7 to V1' through V7', respectively. During time interval 721, the voltage on signal SRC can be at 0V (e.g., source 213 can be coupled to a ground node (e.g., ground node 290).

During a time interval 722 (which is after time interval 721), memory device 200 can increase the value of the voltage applied to signal SRC from 0V to a value VsrcH, which is a positive value (e.g., VsrcH=5V). The voltage on signal SRC can remain at value VsrcH for a time portion 722" of time interval 722. After time portion 722", the voltage on signal SRC can be decreased to value Vsrc' (e.g., 0V).

Operation 712 can cause the pillars (e.g., pillars 231, 232, 233, and 234 (FIG. 3) of memory device 200 to have discharged negative body potential. However, weak erase stress (e.g., in lower level memory cells) may be possible. Further, unlike operation 512 of FIG. 5, operation 712 of FIG. 6 lacks the selective adjustment of pillar potential according to program level of the memory cells. Therefore, although operation 712 can cause the pillars to have a relatively lower negative potential, the improvements and benefits of operation 712 may not be the same as that of operation 512 described above with reference to FIG. 2 through FIG. 5.

The illustrations of the apparatuses (e.g., memory devices 100 and 200) and methods (e.g., operations of memory devices 100 and 200) are intended to provide a general understanding of the structure of different embodiments and are not intended to provide a complete description of all the elements and features of an apparatus that might make use of the structures described herein.

Any of the components described above with reference to FIG. 1 through FIG. 7 can be implemented in a number of ways, including simulation via software. Thus, apparatuses (e.g., memory devices 100 and 200 or part of each of memory devices 100 and 200, including a control unit in these memory devices, such as control unit 118 (FIG. 1)) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The apparatuses (e.g., memory devices 100 and 200) and methods described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7 include apparatuses and methods of operating the apparatuses. One of the apparatuses includes a memory cell string having first, second, third, fourth, and fifth memory cells; access lines including first, second, third, fourth, and fifth access lines coupled to the first, second, third, fourth, and fifth memory cells, respectively, and a module. The first memory cell is between the second and third memory cells. The second memory cell is between the first and fourth memory cells. The third memory cell is between the first and fifth memory cells. The module is to couple the first access line to a ground node at a first time of a memory operation, couple the second and third access lines to the ground node at a second time of the operation after the first time, and couple the fourth and fifth access lines to the ground node at a third time of the operation after the second time. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:
   a memory cell string including memory cells, the memory cells including a first memory cell, a second memory cell, a third memory cell, a fourth memory cell, and a fifth memory cell, the first memory cell being between the second and third memory cells, the second memory cell being between the first and fourth memory cells, and the third memory cell being between the first and fifth memory cells;
   access lines including first, second, third, fourth, and fifth access lines coupled to the first, second, third, fourth, and fifth memory cells, respectively;
   a data line coupled to the memory cell string; and
   a module to couple the first access line to a ground node at a first time of an operation of the apparatus, couple the second and third access lines to the ground node at a second time of the operation after the first time, and couple the fourth and fifth access lines to the ground node at a third time of the operation after the second time, wherein the operation is performed after a sensing stage of a read operation, and the module is to couple the data line to the ground node during a time interval between the first time and the third time.

2. The apparatus of claim 1, wherein:
   the memory cell string includes a first additional memory cell, a second additional memory cell, a third additional memory cell, a fourth additional memory cell, and a fifth additional memory cell, the first additional memory cell being between the second and third memory cells, the second additional memory cell being between the second memory cell and the fourth memory cell, and the third additional memory cell being between the third memory cell and the fifth memory cell, the fourth memory cell being between the second additional memory cell and fourth additional memory cell, and the fifth memory cell is between the third additional memory cell and the fifth additional memory cell;
   the access lines include first, second, third, fourth, and fifth additional access lines coupled to the first, second, third, fourth, and fifth additional memory cells, respectively; and
   the module is to couple the first additional access line to the ground node at the first time, couple the second and third additional access lines to the ground node at the second time, and couple the fourth and fifth additional access lines to the ground node at the third time.

3. The apparatus of claim 1, further comprising a source coupled to the memory cell string, wherein the module is to couple the source to a positive voltage during a time interval between the first time and the third time.

4. The apparatus of claim 1, wherein the module is further to:
   couple the first access line to a first positive voltage before the first time interval;
   couple the second access line to a second positive voltage before the first time interval; and couple the third access line to a third positive voltage before the first time interval.

5. The apparatus of claim 4, wherein the first, second, and third positive voltages have a same value.

6. The apparatus of claim 4, wherein the second positive voltage has a value different from a value of the first positive voltage and different from a value of the third positive voltage.

7. The apparatus of claim 6, wherein the value of the first positive voltage is equal to the value of the third voltage.

8. The apparatus of claim 6, wherein the value of the first positive voltage is less than the value of the second positive voltage and less than the value of the third positive voltage.

9. An apparatus comprising:
- a memory cell string including memory cells the memory cells including a first memory cell, a second memory cell, a third memory cell, a fourth memory cell, and a fifth memory cell, the first memory cell being between the second and third memory cells, the second memory cell being between the first and fourth memory cells, and the third memory cell being between the first and fifth memory cells;
- access lines including first, second, third, fourth, and fifth access lines coupled to the first, second, third, fourth, and fifth memory cells, respectively;
- a module to couple the first access line to a ground node at a first time of an operation of the apparatus, couple the second and third access lines to the ground node at a second time of the operation after the first time, and couple the fourth and fifth access lines to the ground node at a third time of the operation after the second time; and
- a source coupled to the memory cell string, wherein the module is to couple the source to the ground node during a time interval between the first time and the third time.

10. The apparatus of claim 9, further comprising a data line coupled to the memory cell string, wherein the module is to couple the data line to a positive voltage during a time interval between the first time and the third time.

11. The apparatus of claim 9, wherein the operation is performed after a sensing stage of a read operation.

12. The apparatus of claim 9, wherein the operation is performed after a sensing stage of a write operation.

* * * * *